US012550288B2

(12) United States Patent
Yow et al.

(10) Patent No.: US 12,550,288 B2
(45) Date of Patent: Feb. 10, 2026

(54) COMMON FAN PLENUM WITH SEPARATORS BETWEEN FANS AND IMPEDANCE ELEMENT AT INLET TO REDUCE RECIRCULATION UPON FAN FAILURE

(71) Applicant: HEWLETT PACKARD ENTERPRISE DEVELOPMENT LP, Spring, TX (US)

(72) Inventors: See Yun Yow, Singapore (SG); James D. Hensley, Rocklin, CA (US); Mun Hoong Tai, Singapore (SG)

(73) Assignee: Hewlett Packard Enterprise Development LP, Spring, TX (US)

( * ) Notice: Subject to any disclaimer, the term of this patent is extended or adjusted under 35 U.S.C. 154(b) by 339 days.

(21) Appl. No.: 18/497,088

(22) Filed: Oct. 30, 2023

(65) Prior Publication Data

US 2025/0142763 A1    May 1, 2025

(51) Int. Cl.
*H05K 7/20*    (2006.01)

(52) U.S. Cl.
CPC ..... *H05K 7/20145* (2013.01); *H05K 7/20736* (2013.01)

(58) Field of Classification Search
CPC ........... H05K 7/20727; H05K 7/20145; H05K 7/2019; H05K 7/20736; H05K 7/20172; H05K 7/20181; H05K 7/20136; H05K 7/20209; G06F 1/20; F04D 25/166; F04D 19/002; F04D 25/14
USPC ...................................................... 361/679.5
See application file for complete search history.

(56) References Cited

U.S. PATENT DOCUMENTS

| | | | |
|---|---|---|---|
| 7,515,411 B2 | 4/2009 | Woolsey et al. | |
| 2010/0025017 A1* | 2/2010 | Zhang | F04D 29/601 165/104.31 |
| 2014/0036441 A1* | 2/2014 | Mashak | F04D 27/002 361/695 |
| 2014/0086732 A1* | 3/2014 | Kelaher | H05K 7/20145 29/888.021 |

(Continued)

OTHER PUBLICATIONS

Kimbrer Computer ApS, "HP 662518-001—HP Fan Cage for DL380 G8," Retrieved online Aug. 3, 2023, 7 pages.

(Continued)

*Primary Examiner* — Mandeep S Buttar
(74) *Attorney, Agent, or Firm* — Jones Robb PLLC

(57) ABSTRACT

An information processing device comprises heat generating components, a plenum, and fans arranged to flow air through the plenum and to cool the heat generating components. The device also comprises a recirculation inhibition mechanism to reduce the amount of air recirculation in the event a fan fails. The recirculation inhibition mechanism comprises a plenum impedance element extending across the plenum such that the air passing through the plenum passes through the plenum impedance element prior to reaching the fans, and dividers disposed in the plenum and defining sub-compartments in the plenum. Each of the sub-compartments corresponds to one of the fans and is configured to supply air to or receive air from the corresponding fan. In the event of one of the fans failing, air recirculating through the failed fan passes though the plenum impedance element twice before reaching an adjacent fan.

20 Claims, 9 Drawing Sheets

(56) References Cited

U.S. PATENT DOCUMENTS

| | | | | |
|---|---|---|---|---|
| 2016/0327062 A1* | 11/2016 | Amin-Shahidi | ... | H05K 7/20736 |
| 2017/0215300 A1* | 7/2017 | Salmond | ............ | H05K 7/20172 |
| 2017/0221526 A1* | 8/2017 | Albrecht | ............ | H05K 7/20736 |
| 2018/0235102 A1* | 8/2018 | Anderl | ................ | F04D 25/0613 |
| 2020/0154600 A1* | 5/2020 | Gupta | .................. | H05K 7/2019 |
| 2022/0201900 A1* | 6/2022 | Ma | ..................... | H05K 7/20736 |

OTHER PUBLICATIONS

Nortek Air Solutions, LLC, "Improving Air Handler Reliability at Blue Cross Blue Shield," Solving Issues of Reliability, Efficiency, Case Study, Apr. 28, 2015, 4 pages.

* cited by examiner

COMMON FAN PLENUM WITH SEPARATORS BETWEEN FANS AND IMPEDANCE ELEMENT AT INLET TO REDUCE RECIRCULATION UPON FAN FAILURE

INTRODUCTION

Information processing devices, such as computers (e.g., tower servers, rack-mount servers, blade servers, etc.) and networking devices (e.g., switches, routers, access points, etc.) generate heat while powered up and in use. Consequently, such devices may be provided with cooling systems to remove heat therefrom. Often, the cooling system comprises a group of fans that are configured to flow air through the device to cool the heat generating components thereof. The air absorbs heat generated by the various components of the device and the heated air is exhausted, thus cooling the components and removing the absorbed heat from the device. The more heat generated by the device, the more airflow may be required to keep the components within desired operating temperatures.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operations. In the drawings.

DETAILED DESCRIPTION

Some information processing devices have multiple fans which are disposed within a common plenum. During normal operation, the fans pull air through one side of the plenum and push air out the other side, thus causing air to flow through the device to cool the heat generating components thereof. If one of the fans fails, it may become possible for air to begin flowing backwards through the failed fan and into the inlets of the other still-operational fans. This phenomenon is called recirculation.

Figure 1:
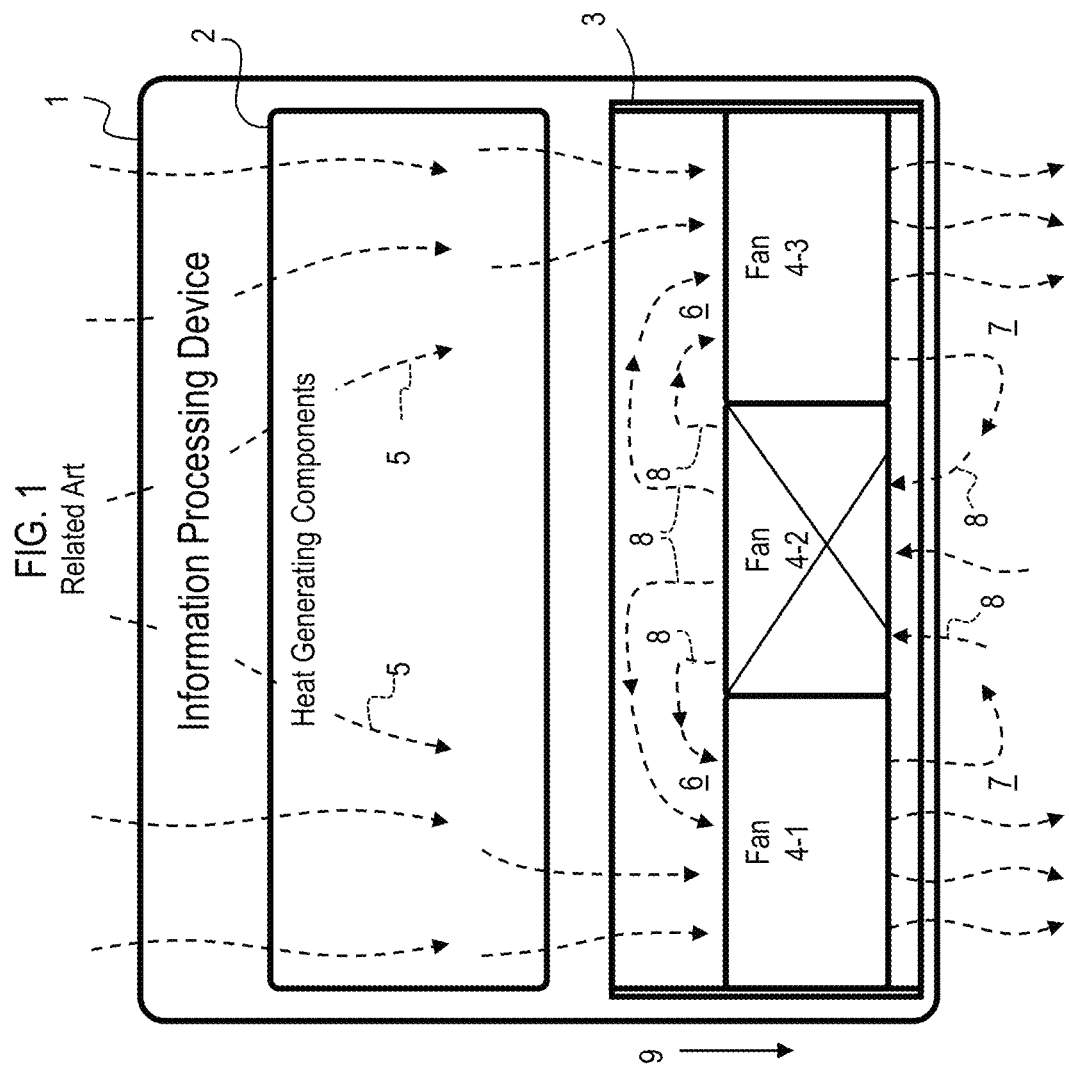
FIG. 1 is a block diagram schematically illustrating an information processing device without separators and in a fan-failed state.

The cause of recirculation will be described with reference to FIG. 1 which illustrates an information processing device 1. The information processing device 1 comprises heat generating components 2, a fan plenum 3, and multiple fans 4 (e.g., fans 4-1, 4-2, and 4-3). The fans 4 are arranged to flow cooling airflows 5 through the device 1 and across the heat generating components 2 to cool the heat generating components 2. The fans 4 do this by pushing or pulling air through the fan plenum 3 (in FIG. 1, the fans 4 blow in the direction 9, but they could blow in the opposite direction, in which case the illustrated airflows would be reversed). In FIG. 1, the fan 4-2 has failed. However, the fans 4-1 and 4-3 are still operational, and they generate low-pressure zones 6 in the plenum on the inlet side of the fans 4-1 and 4-2 and relatively high-pressure zones 7 at an outlet side of the fans 4-1 and 4-2. The failed fan 4-2 forms a conduit which communicably connects the high-pressure zones 7 on the outlet side of the fans 4 to the low-pressure zone 6 on the inlet side of the fans 4, and therefore some air 8 is drawn backwards through the failed fan 4-2 (air tends to flow from high pressure to low pressure). This recirculated air 8 in the common plenum 3 is then drawn into the inlets of the operational fans 4-1 and 4-3.

Such recirculation is detrimental to the cooling of information processing devices. The cooling capability of an information processing device is already diminished by the loss of the failed fan, and the recirculation of the air through the failed fan diminishes the cooling capability of the system even further. The recirculated air which flows backwards through the failed fan does not pass over the heat generating components, and thus does not contribute to cooling them. Moreover, the recirculated air reduces the amount of cooling air that is pulled through the remainder of the device. Each fan may have a certain airflow capacity, and when recirculated air is drawn through a fan, this takes up some of the airflow capacity of the remaining fans, leaving less airflow capacity for the cooling airflows. For example, in FIG. 1 the recirculated airflows 8 take up some of the airflow capacity of the fans 4-1 and 4-3, thus reducing the proportion of the fans 4-1 and 4-3 airflow capacity that can be applied to inducing the cooling airflows 5 to flow through the device 1. For instances, if it is assumed that each fan 4 can hypothetically sustain a flow rate of 10 m³/h and the recirculated air 8 is pulled through the fans 4-1 and 4-3 at a rate of 4 m³/h (2 m³/h per fan 4-1 and 4-3), then the airflow capacity available for driving the cooling airflows 5 is reduced from 20 m³/h to 16 m³/h (almost a 20% reduction) due to the recirculated air 8 consuming some of the capacity of the fans 4-1 and 4-2. Thus, if one fan fails, recirculation may result in there being less cooling airflow for the heat generating components, and in some cases, the temperatures of the heat generating components may exceed temperature ratings thereof, potentially causing damage, reducing the lifespan of the components, and/or resulting in throttling of performance.

One way to address the issue of recirculation is to replace the fan when it fails. However, in some information processing devices, this may not be a feasible solution. In particular, in some information processing devices the fans are all provided as a unitary multi-fan package or module, with all of the fans being permanently or semi-permanently affixed in the multi-fan module. Thus, removing an individual fan may require removing the entire multi-fan module from the information processing device and then disassembling the multi-fan module. Disassembly of the multi-fan module may be difficult, as it is usually not designed for easy disassembly, and may involve destructive disassembly. Thus, while it may be technically possible to remove an individual fan in information processing devices that utilize a unitary multi-fan module, it is often not a desired option and may not be practically feasible in some cases. Instead, a common practice when an individual fan fails in such devices is to replace the entire multi-fan module as a unit. As another example, in some information processing devices the fans are not designed to be replaceable, whether individually or as a unit—for example, in some lower cost information processing devices, the device is not designed to be opened or parts thereof removed. In such information processing devices, the entire device may be replaced if a fan thereof fails. However, replacing a multi-fan module, or the entire information processing device, in response to a single fan thereof failing is wasteful and costly. Doing so entails removing, and in some cases disposing of, fans or other components that are still perfectly good, and paying for new replacements that are not strictly necessary (in the sense that the component they are replacing was not failed).

Moreover, even in systems in which the fans are designed to be replaceable (whether individually or as part of replacing an entire multi-fan module), the timing of the replacement can be a challenge. The information processing device may need to continue operating in the time period between when the fan fails and when the fan can ultimately be replaced. During this interim period, the diminished cooling capability of the information processing device (due, in part, to recirculation) may lead to components exceeding desired operational temperature ranges, and consequently they may experience damage, reduction in lifespan, throttling of performance, or other thermal issues. In addition, failures are usually not planned and can occur at inconvenient times, and therefore the user of the device may be forced to select between two undesirable options: (1) waiting until a convenient time to effect the fan replacement (e.g., a scheduled maintenance period or a predicted timing of low system usage), thus increasing the risk of damage or other thermal issues by prolonging the period in which the device operates with diminished cooling capability, or (2) replacing the fan quickly to minimize the risk of thermal issues, and consequently not being able to schedule the replacement at a convenient timing, potentially resulting in disruption to operations (e.g., the information processing device may have to be taken offline during a period of high system usage). Accordingly, even in systems in which fan replacement is technically and economically feasible, there are some drawbacks to relying on fan replacement as the primary means for combating recirculation.

Another way to address the issue of recirculation is to use mechanisms which can automatically detect a failed fan and block off airflow through the fan in response to a failure. For example, some fan systems have deployable baffles which can block airflow through a fan if a failure is detected. However, such mechanisms to selectively block airflow through failed fans tend to be complicated and costly, and thus may not be suitable for some systems. In particular in some lower cost information processing devices, complicated and expensive fan systems (such as those that can automatically block off airflow in response to a failure) may not be practical or feasible. Furthermore, the reliance on active systems for detection of failures and deployment of baffles increases the complexity of the system and can introduce points of failure. Additionally these baffles or similar structures can reduce the airflow performance of the device in normal operation, which can require more fans or increased fan speed.

To address these and other issues, example information processing devices disclosed herein include a recirculation inhibition mechanism which reduces the amount of air recirculation that occurs when a fan fails. Moreover, the recirculation inhibition mechanism may be entirely passive (e.g., no failure detection or active driving of devices is needed for the recirculation inhibition) and relatively inexpensive. Because the amount of air recirculation is reduced, the degree to which the device's cooling capabilities are diminished due to the air recirculation is also reduced. In other words, when an individual fan fails, the example information processing devices disclosed herein are better able to cope with the fan failure and to continue cooling themselves. Consequently, the temperatures of the components in the information processing devices may be more likely to remain within desired operating ranges, notwithstanding the fan failure. In some cases, the improvement in cooling capability may be sufficient to allow for the example information processing devices to remain in operation for extended periods of time after a fan failure without thermal issues (e.g., without exceeding desired operational temperature ranges and consequent damage, loss of component lifespan, and/or throttling of performance).

Thus, whereas previously in some systems the user may have had to choose between replacing a failed fan relatively quickly after the failure, potentially at an inconvenient timing, or risking thermal issues if the replacement is delayed to a convenient timing, now in some examples disclosed herein the replacement can be delayed for a relatively long time without risking thermal issues. This may allow for the replacement to be scheduled at a timing that is more convenient and less disruptive to operations, such as during a scheduled maintenance period or a time of low usage.

Moreover, in some cases, the improvement in cooling capability may be sufficient to allow some example information processing devices disclosed herein to continue operating indefinitely after a fan failure without running into thermal issues. In other words, in some examples, the replacement of an individual failed fan may now be optional, rather than a necessity as it was previously in some systems. The freedom to choose not to replace a failed fan may be particularly beneficial in situations where the fans are not easily individually replaceable (e.g., when provided as part of a multi-fan module). In some scenarios, the user may prefer to let the system operate indefinitely with one failed fan rather than incurring the cost and waste associated with replacing an entire multi-fan module or the entire information processing device.

In some examples disclosed herein, the recirculation inhibition mechanism comprises separators (divider walls) and a plenum impedance element which are both coupled to a common plenum which supplies or receives the airflow from multiple fans. The separators are disposed in the common plenum between each of the fans to separate the plenum into sub-compartments defining separate parallel airflow paths through the plenum. Each fan is either disposed in, or is arranged to supply or receive airflow to, its own corresponding sub-compartment. The plenum impedance element is disposed on or in the plenum such that all the air entering the plenum from an inlet side thereof passes through the plenum impedance element prior to reaching the fans. For example, the plenum impedance element may cover an inlet opening of the plenum or may be disposed inside the plenum between the fans and the inlet opening of the plenum. The separators may extend from the fans to the plenum impedance element such that each sub-compartment is substantially separated from the other sub-compartments in the region between the fans and the plenum impedance element. Thus, in order for air to flow from one sub-compartment to a neighboring sub-compartment, the air must flow either from the outlet side of one compartment to the outlet side of the other compartment, passing through their corresponding fans, or from the inlet side of one compartment to the inlet side of the other compartment, passing through the plenum impedance element at the other end. In order for air to flow between two sub-compartments via their inlet sides, the air passes through the plenum impedance element twice: once as it leaves the inlet side of the sub-compartment with the failed fan and then again as the air enters the inlet side of the neighboring sub-compartment. (Generally, fluid communication between two sub-compartments via their outlet sides is prevented if either or both fans associated with the sub-compartments are operational).

The example arrangement described above reduces the degree of air recirculation in response to a fan failure. When a fan fails, recirculated air flowing backward through the failed fan to the inlet of an adjacent fan cannot simply flow directly to the inlet of an adjacent fan as was the case in other devices. Instead, the recirculating air must pass through the plenum impedance element (twice) before it can enter the adjacent fan, once as it exits the sub-compartment of the failed fan and once again as it enters the sub-compartment of the adjacent fan. Because the plenum impedance element has a positive airflow impedance, it inhibits these flows of the recirculating air. Thus, less recirculating air ends up traveling along these flow paths than would have in the absence of the plenum impedance element and dividers. Put another way, there is a pressure drop across the plenum impedance element, and therefore the low pressure that is exposed to the sub-compartment with the failed fan is somewhat higher than it would have been absent the dividers and plenum impedance element, resulting in less air getting drawn backward through the failed fan. Some air does still get recirculated, but the amount of recirculated air is less than it would be if the dividers were absent. Because less recirculating air flows from the failed fan, more cooling air can be pulled through the electronic device, allowing the device to remain in thermal limits despite the failed fan.

Turning now to the FIGS. 2-8, various devices, systems, and methods in accordance with aspects of the present disclosure will be described.

FIG. 2-7 are block diagrams schematically illustrating information processing devices 100, 200, 300, and 400. It should be understood that FIG. 2-7 are not intended to illustrate specific shapes, dimensions, or other structural details accurately or to scale, and that implementations of the information processing devices 100, 200, 300, and 400 may have different numbers and arrangements of the illustrated components and may also include other parts that are not illustrated.

Figure 2:
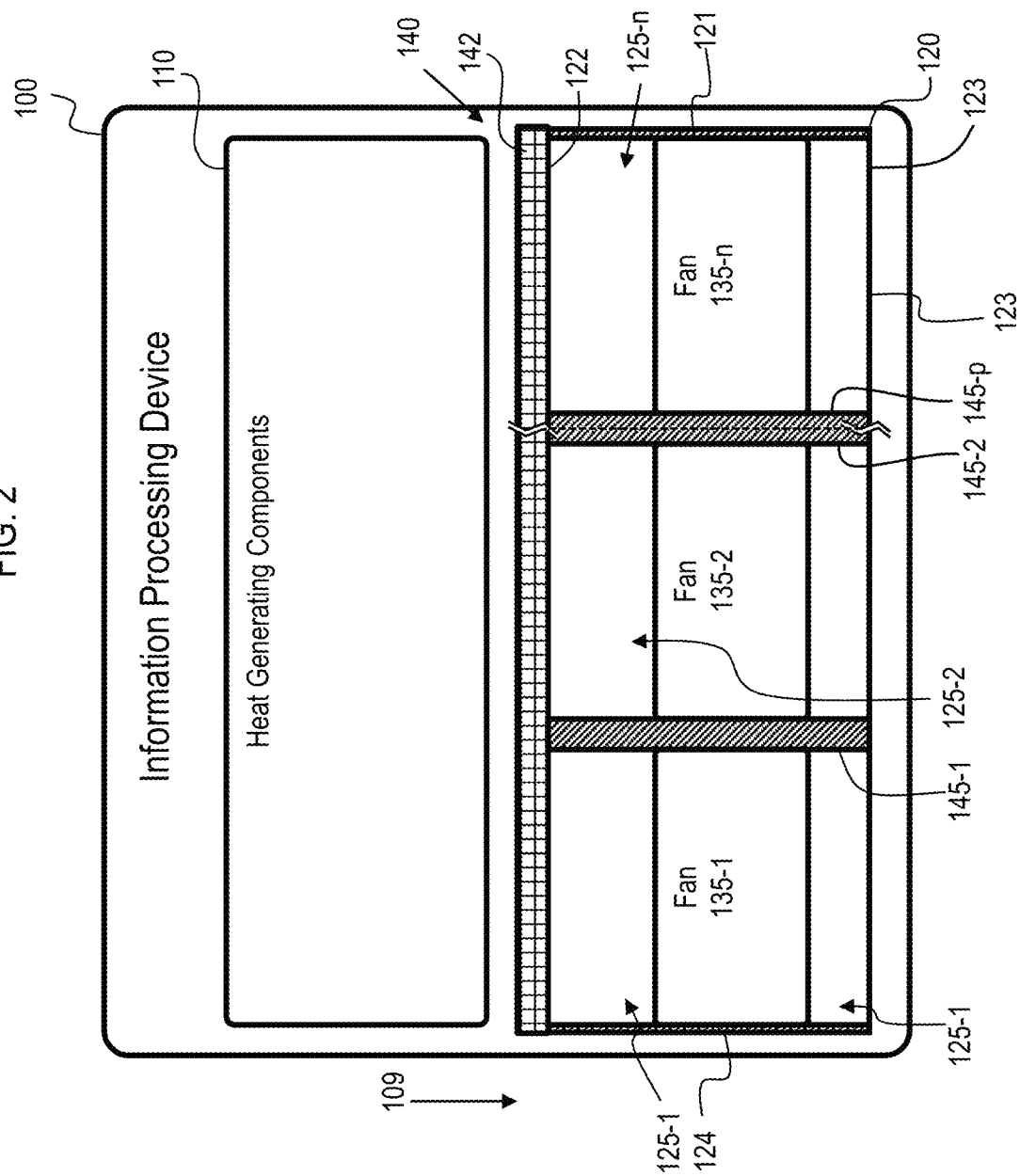
FIG. 2 is a block diagram schematically illustrating an example information processing device with separators.

As shown in FIG. 2, the information processing device 100 comprises heat generating components 110, fans 135, a fan plenum 120, and a recirculation inhibition mechanism 140. The information processing device 100 may comprise a computing device, a networking device, or any other device which processes information (with processing information broadly including storing, retrieving, routing, applying logical or mathematical operations to, analyzing, or otherwise manipulating digital information). The heat generating components 110 may comprise any electronic, optical, electro-optical, or other components of the information processing device 100 that generate heat, such as, for example, a processor, an application specific integrated circuit (ASIC), a network interface controller (NIC), a transceiver, etc.

Figure 3:
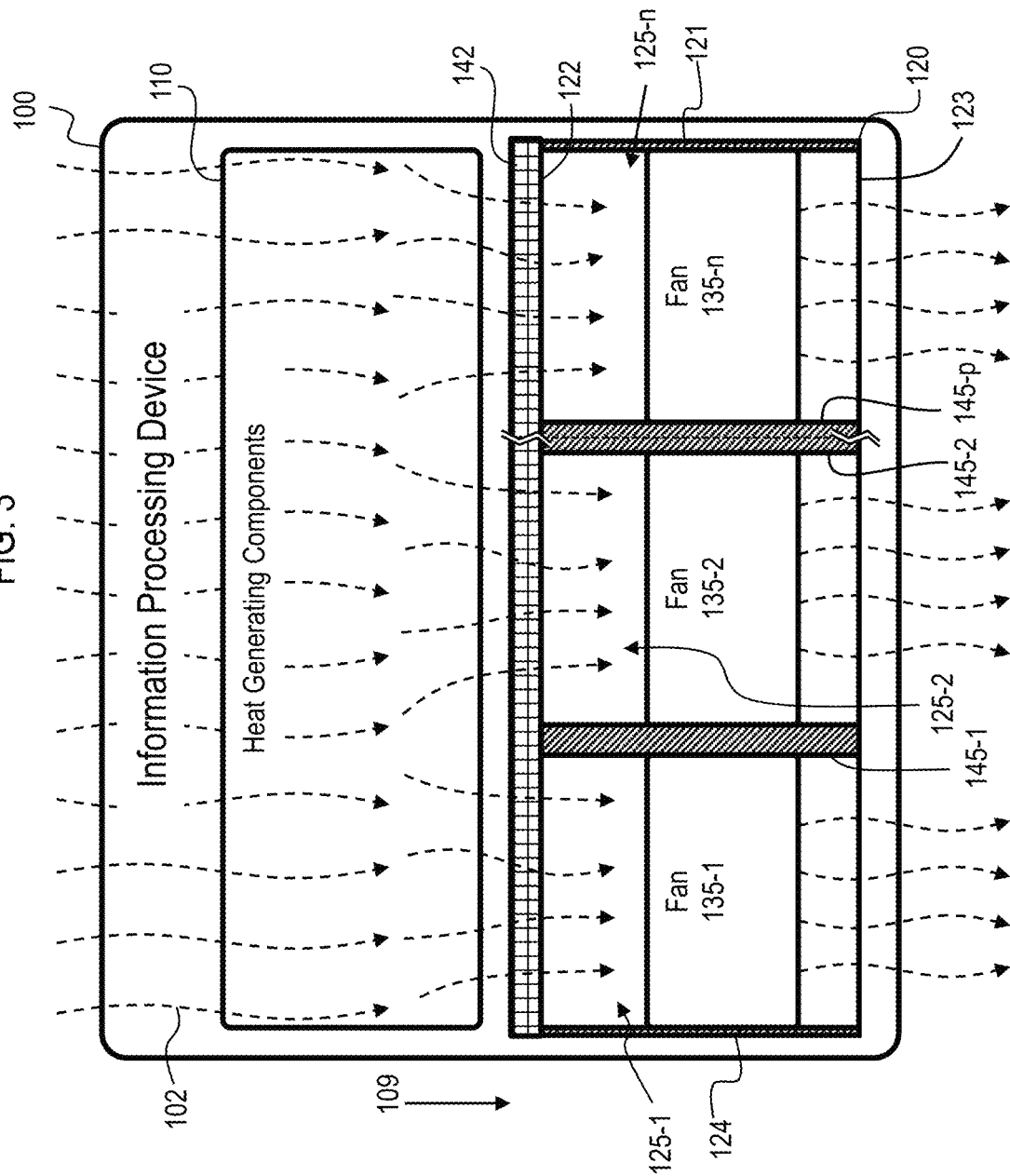
FIG. 3 is a block diagram schematically illustrating the example information processing device of FIG. 1 with airflow depicted in a normal operating state.
Figure 4:
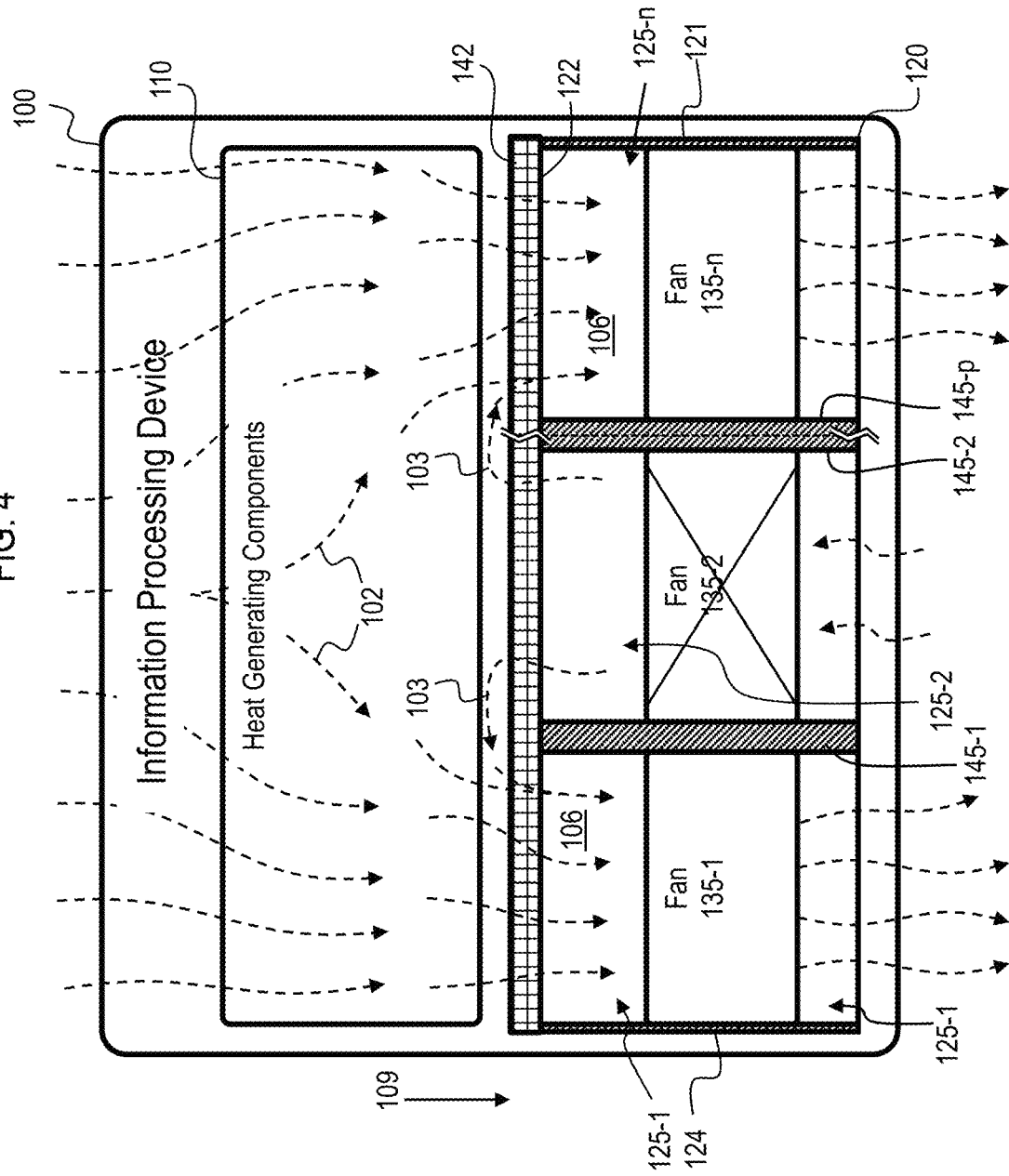
FIG. 4 is a block diagram schematically illustrating the example information processing device of FIG. 1 with airflow depicted in a fan-failed state.

The fans 135 include a plurality of fans 135. In FIG. 1, the fans 135-1, 135-2, . . . 135-$n$ are illustrated, with n being any integer equal to or greater than 2. The fans are arranged in an array within a chassis of the information processing device 100 and configured to flow air through the device 100. In FIGS. 2-4, the fans 135 are oriented to flow air in the general direction 109. Thus, as shown by the dash-lined arrows in FIG. 3 the fans 135 pull cooling air 102 into the device 100, then the cooling air 102 passing over the heat generating component 110 and absorbs heat therefrom, then the heated air 102 passes into the plenum 120, then the air is expelled from the device 100 by the fans 135. In other examples, the fans 135 may be oriented to flow air in the opposite direction, in which case the airflow arrows in FIG. 3 would be reversed (the recirculation inhibition mechanism 140 may also be reversed in orientation, as described below).

The plenum 120 comprises a duct, vent, tube or other partially enclosed conduit which has an inlet opening 122 at one end, an outlet opening 123 at the opposite end, and walls radially surrounding a central axis extending between the inlet opening 122 and the outlet opening 123. The plenum 120 can have any cross-sectional shape, including circular, elliptical, square, rectangular, etc. In one example, the plenum 120 has a rectangular cross-section with four lateral walls parallel to the central axis and coupled together to form a box-like shape. In some examples, the box-like shape may be similar to a 6-sided box except that the end walls, which are perpendicular to the central axis, are omitted and the inlet opening and the outlet opening are provided at the locations where these end walls otherwise would have been located. In other examples, the box-like shape may include one or both of these perpendicular end walls, with the inlet opening and/or outlet opening being formed as apertures in these walls. In FIG. 2, lateral walls 121 and 124 are illustrated, while the other walls of the plenum 120 are omitted from the view to reveal the interior portions of the plenum 120.

As noted above, the fans 135 cause air to flow through the plenum 120. In some examples, this is accomplished by the fans 135 being disposed within the plenum 120, as shown in FIG. 2. In other examples, this is accomplished by disposing the fans 135 outside of the plenum 120 but communicably coupling the fans 135 to the plenum 120 such that the airflow paths through the fans 135 necessarily pass through the plenum 120. For example, the fans 135 may be positioned with their inlet ends adjacent to an outlet opening 123 of the plenum 120, such that air from inside the plenum 120 is drawn into the inlet openings of the fans 135. Or in systems with opposite direction airflow, the fans 135 may be positioned with their outlet ends adjacent to an inlet opening 122 of the plenum 120, such that air expelled by the fans 135 blows into the plenum 120.

As shown in FIG. 2, the recirculation inhibition mechanism 140 comprises a plenum impedance element 142 and separators (divider walls) 145, which are both coupled to the plenum 120. The divider walls 145 are disposed in the plenum 120 between each of the fans 135 to separate the plenum 120 into sub-compartments 125 defining separate parallel airflow paths through the plenum 120. In FIG. 2, each fan 135 is disposed in its own corresponding sub-compartment 125. In other examples, the fans 135 are not necessarily disposed in the sub-compartments 125, but are instead arranged to supply air to or receive air from their corresponding sub-compartment 125. If there are n fans 135-1 to 135-$n$ then there may be n sub-compartments 125-1 to 125-$n$, with fan 135-1 corresponding to sub-compartment 125-1, fan 135-2 corresponding to sub-compartment 125-2, and so on. To form the n-sub-compartments 125-1 to 125-$n$, p divider walls 145-1 to 145-$p$ are provided, wherein p=n−1. The divider walls 145 may extend at least from the inlets of the fans 135 to the plenum impedance element 142. In FIG. 2, the divider walls 145 extend the full length of the plenum 120, but in other examples the divider walls 145 may extend only part of the length of the plenum 120.

The plenum impedance element 142 is disposed on or in the plenum 120 such that all the air entering the plenum 120 via the inlet opening 122 passes through the plenum impedance element 132. In the example illustrated in FIG. 1, this is achieved by placing the plenum impedance element 132 on the plenum 120 covering the inlet opening 122. In other examples, the plenum impedance element 132 is disposed inside the plenum 120 between the fans 135 and the inlet opening 122. The plenum impedance element 142 comprises a structure which allows air to flow therethrough but which imposes a non-zero positive impedance to the airflow, such as a wire screen, mesh, or honeycomb, a lattice, a perforated sheet (e.g., sheet metal), or the like. In some examples, the plenum impedance element 142 may be a separate part from the plenum 120 which is disposed on or in the plenum 120. In other examples, the plenum impedance element 142 may be part of the plenum 120—for example, the plenum impedance element 142 may from an end wall of the plenum 120.

In addition to the functions described herein in relation to reducing air recirculation, the plenum impedance element 142 may provide electromagnetic interference (EMI) containment and also may prevent visibility and/or infiltration of objects into an interior portion of the information processing device. For example, in some information processing devices, the fans 135 may be provided as part of a fan module which is removable, and the plenum impedance element 142 may thus serve to separate the interior of the device 100 from the exterior (e.g., to prevent insertion of foreign objection) when the fan module is removed.

The divider walls 145 are arranged such that, in order for air to flow from one sub-compartment 125 into a neighboring sub-compartment 125 via their respective inlet side (without going through the fans 135), the air must first pass through the plenum impedance element 142 as it leaves the first sub-compartment 125 and then the air must again pass through the plenum impedance element 142 as it enters the neighboring sub-compartment 125. In other words, the plenum impedance element 142 separates each of the sub-compartments 125 from one another in terms of fluid connections therebetween at least within the region between the fans 135 and the plenum impedance element 142. Generally, fluid communication between two given sub-compartments 125 via their outlet sides would require air to flow through the fans 135 associated with the sub-compartments, and thus such communication is prevented when either or both of their fans 135 are both operational. If one fan 135 of the two given compartments fails 125, fluid communication between the two given sub-compartments 125 via their outlet sides is still prevented by the remaining operational fan 135, but fluid communication between the two sub-compartments 125 may occur via their inlet sides and the plenum impedance element 142.

The example arrangement described above reduces the degree of air recirculation in response to a fan failure. For example, FIG. 4 illustrates the information processing device 100 in a state in which the fan 135-2 has failed. The fans 135-1 and 135-$n$ are still operational, and thus they continue to pull cooling airflow 102 through the information processing device 100. Moreover, because the fan 135-2 has failed, the fan 135-2 and compartment 125-2 now form an alternate path from the exterior of the device 100 to the inlets of the fans 135-1 and 135-$n$, the fans 135-1 and 135-$n$ will also pull some recirculating airflow 103 backwards through the fan 135-2.

However, unlike in the device 1 of FIG. 1, in the device 100 of FIG. 4 the recirculating airflow 103 cannot simply flow directly from the failed fan 135-2 to the inlets of the adjacent fans 135-1 and 135-$n$. Instead, the recirculating air 103 must pass through the plenum impedance element 142 twice before it can enter the adjacent fans 135-1 and 135-$n$. That is, the recirculating air 103 passes through the impedance element 142 once as it exits the sub-compartment 125-2 of the failed fan 135-2 and once again as it enters the sub-compartment 125-1 or 125-$n$ of the adjacent fan 135-1 or 135-$n$. Because plenum impedance element 142 has a positive airflow impedance, the plenum impedance element 142 inhibits the airflow traveling along these paths. Accordingly, the amount of recirculating air 103 is greatly reduced. Put another way, there is a pressure drop across the plenum impedance element 142 such that the effective pressure seen in the sub-compartment 135-2 is somewhat higher than it otherwise would have been and therefore the recirculating air 103 is pulled less strongly into the sub-compartment 135-2. Some air 103 does still get recirculated, but the amount of recirculated air 103 is less than it would be if the dividers 145 and plenum impedance element 142 were absent. Because less recirculating air 103 flows from the failed fan 135-2, more cooling air 102 can be pulled through the information processing device 100, allowing the device 100 to remain in thermal limits despite the failed fan 135-2.

Figure 5:
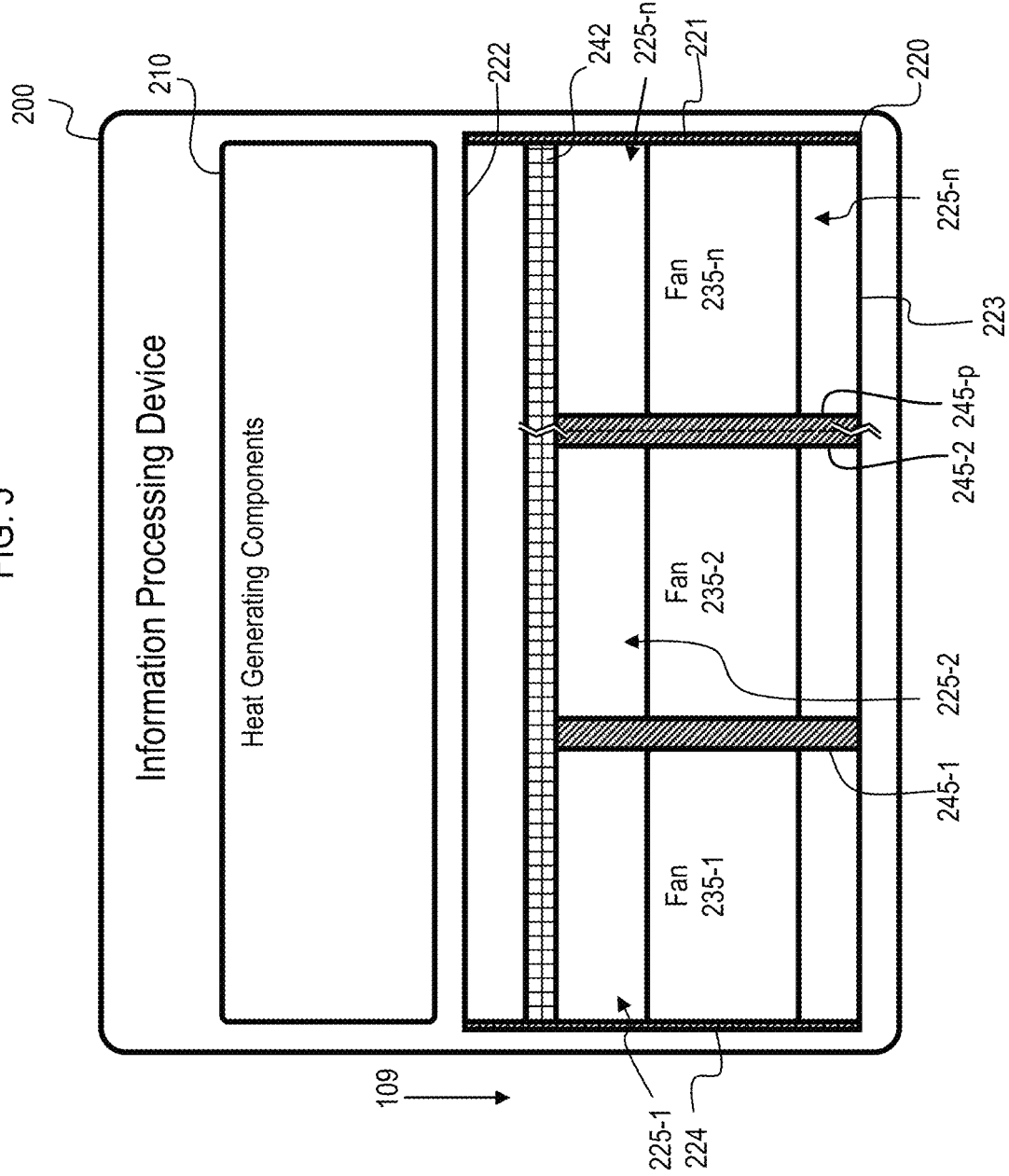
FIG. 5 is a block diagram schematically illustrating another example information processing device with separators.

Turning now to FIG. 5, another example information processing device 200 will be described. Some components of the information processing device 200 correspond to (i.e., are the same as, similar to, and/or example configurations of) components of the information processing device 100 described above. The components of the information processing device 200 and the components of the information processing device 100 which correspond to one another are given reference numbers with the same last two digits, such as 135 and 235. The descriptions above of the components of the information processing device 100 are applicable to the corresponding components of the information processing device 200 (unless otherwise indicated or logically contradictory), and thus duplicative descriptions of some aspects already described above are omitted below.

As shown in FIG. 5, the information processing device 200 comprises heat generating components 210, fans 235, a fan plenum 220, and a recirculation inhibition mechanism 240 (compromising dividers 245 which form sub-compartments 225 and a plenum impedance element 242). These components of the device 200 are similar to the corresponding components of the device 100 except that in the device 200 the plenum impedance element 242 is disposed within the interior of the plenum 220. That is, rather than the plenum impedance element 242 covering the inlet opening 222 of the plenum 220, the plenum impedance element 242 is disposed between the inlet opening 222 and the fans 235.

Other than this, the structure, function, and operation of the device 200 is the same as that described above in relation to the device 100.

Figure 6:
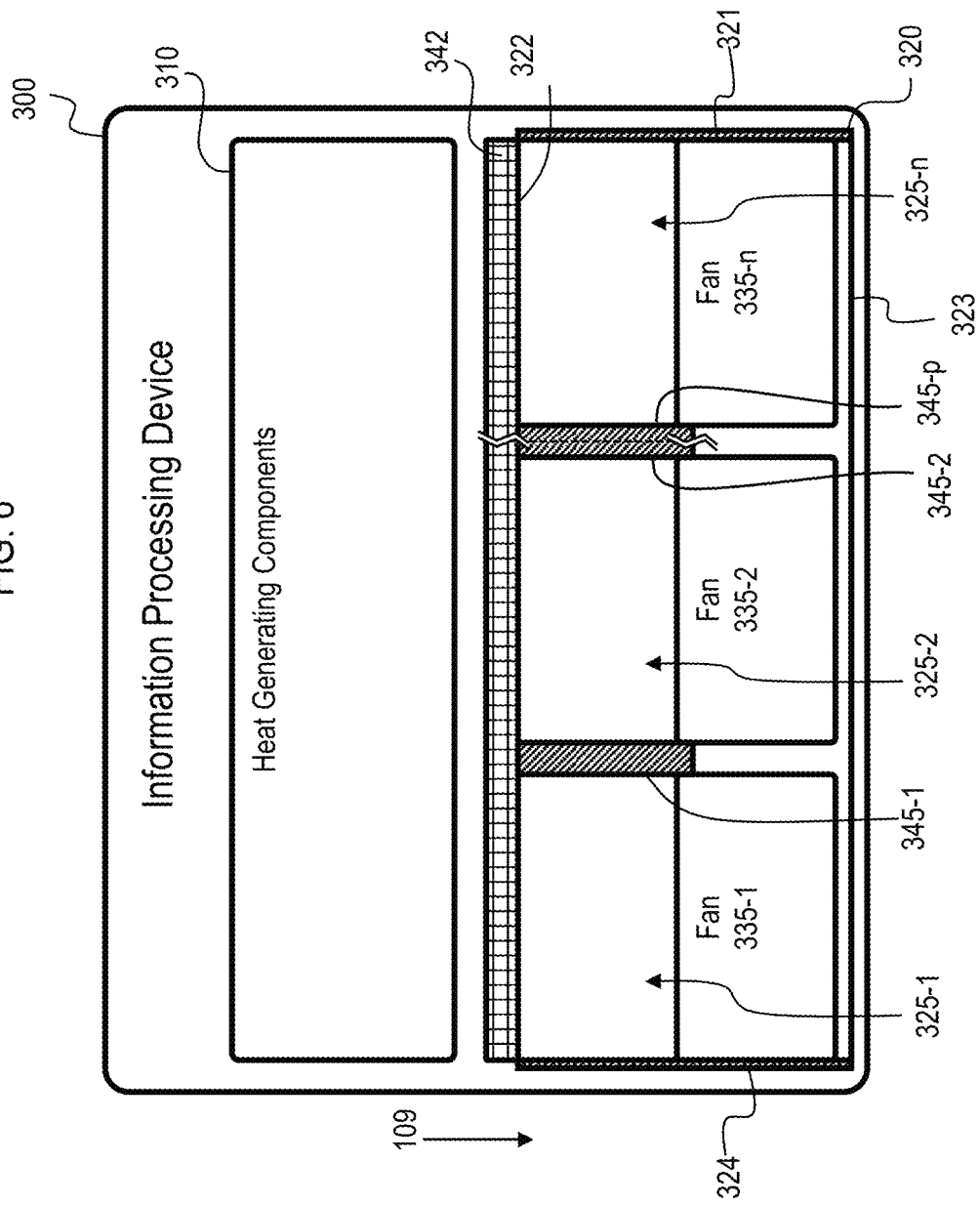
FIG. 6 is a block diagram schematically illustrating yet another example information processing device with separators.

Turning now to FIG. 6, another example information processing device 300 will be described. Some components of the information processing device 300 correspond to (i.e., are the same as, similar to, and/or example configurations of) components of the information processing device 100 described above. The components of the information processing device 300 and the components of the information processing device 100 which correspond to one another are given reference numbers with the same last two digits, such as 135 and 335. The descriptions above of the components of the information processing device 100 are applicable to the corresponding components of the information processing device 300 (unless otherwise indicated or logically contradictory), and thus duplicative descriptions of some aspects already described above are omitted below.

As shown in FIG. 6, the information processing device 300 comprises heat generating components 310, fans 335, a fan plenum 320, and a recirculation inhibition mechanism 340 (compromising dividers 345 which form sub-compartments 325 and a plenum impedance element 342). These components of the device 300 are similar to the corresponding component of the device 100 except that in the device 300 the dividers 345 do not extend the full length of the plenum 320. Instead, the dividers 345 extend from at least the inlet sides of the fans 335 to the plenum impedance element 342. Other than this, the structure, function, and operation of the device 300 is the same as that described above in relation to the device 100.

Figure 7:
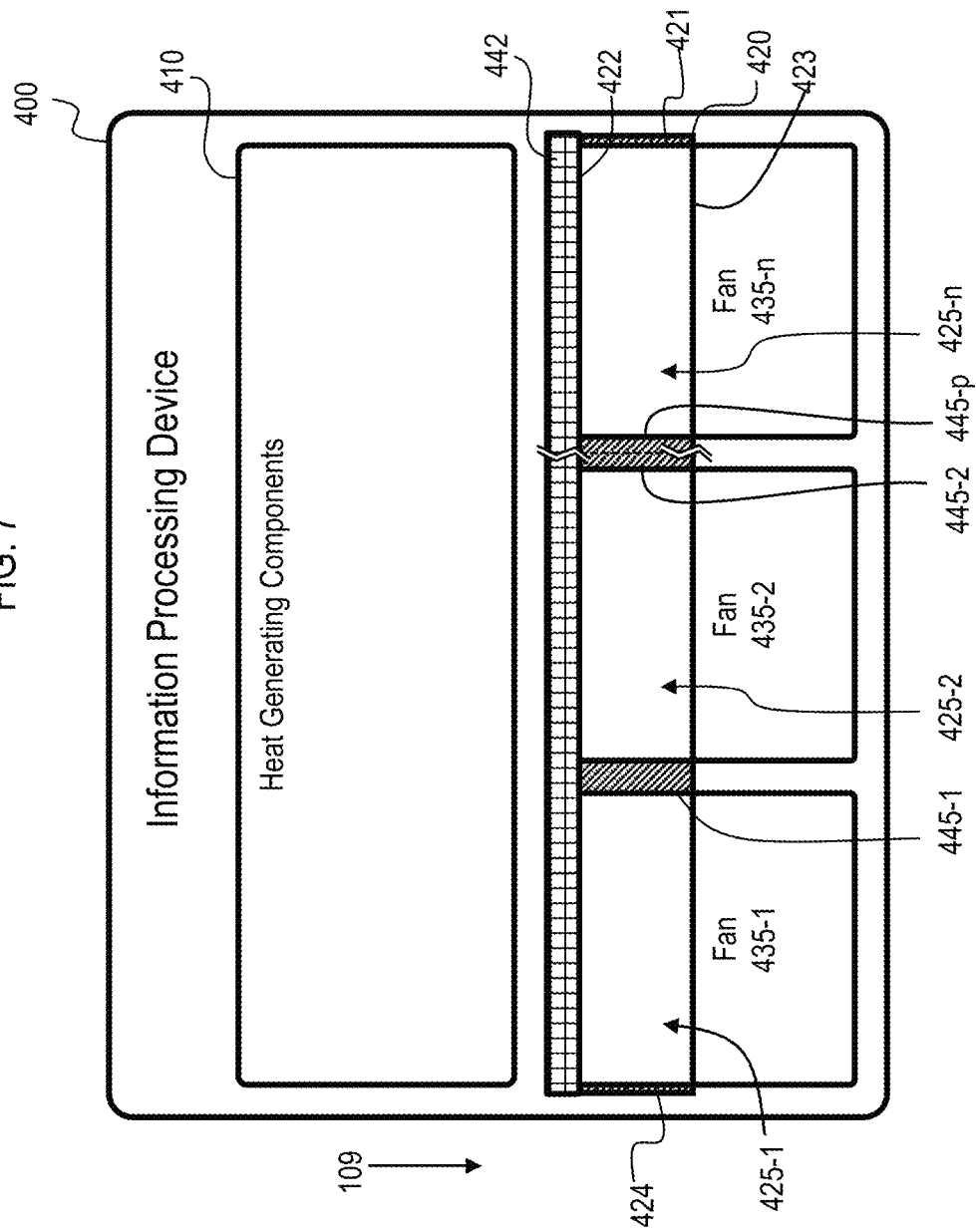
FIG. 7 is a block diagram schematically illustrating yet another example information processing device with separators.

Turning now to FIG. 7, another example information processing device 400 will be described. Some components of the information processing device 400 correspond to (i.e., are the same as, similar to, and/or example configurations of) components of the information processing device 100 described above. The components of the information processing device 400 and the components of the information processing device 100 which correspond to one another are given reference numbers with the same last two digits, such as 135 and 435. The descriptions above of the components of the information processing device 100 are applicable to the corresponding components of the information processing device 400 (unless otherwise indicated or logically contradictory), and thus duplicative descriptions of some aspects already described above are omitted below.

As shown in FIG. 7, the information processing device 400 comprises heat generating components 410, fans 435, a fan plenum 420, and a recirculation inhibition mechanism 440 (compromising dividers 445 which form sub-compartments 425 and a plenum impedance element 442). These components of the device 400 are similar to the corresponding component of the device 100 except that in the device 400 fans 435 are not disposed inside of the plenum 420. Instead, the fans 435 (i.e., fans 435-1, 435-2, ... 435-n) are disposed such that the inlets of the fans 435 are adjacent to the outlet opening 423 of the plenum 420 so that the air pulled into the fan 435 is pulled through the plenum 420 (note that the fans 435 blow air along the direction 109). Other than this, the structure, function, and operation of the device 400 is the same as that described above in relation to the device 100.

Figure 8:
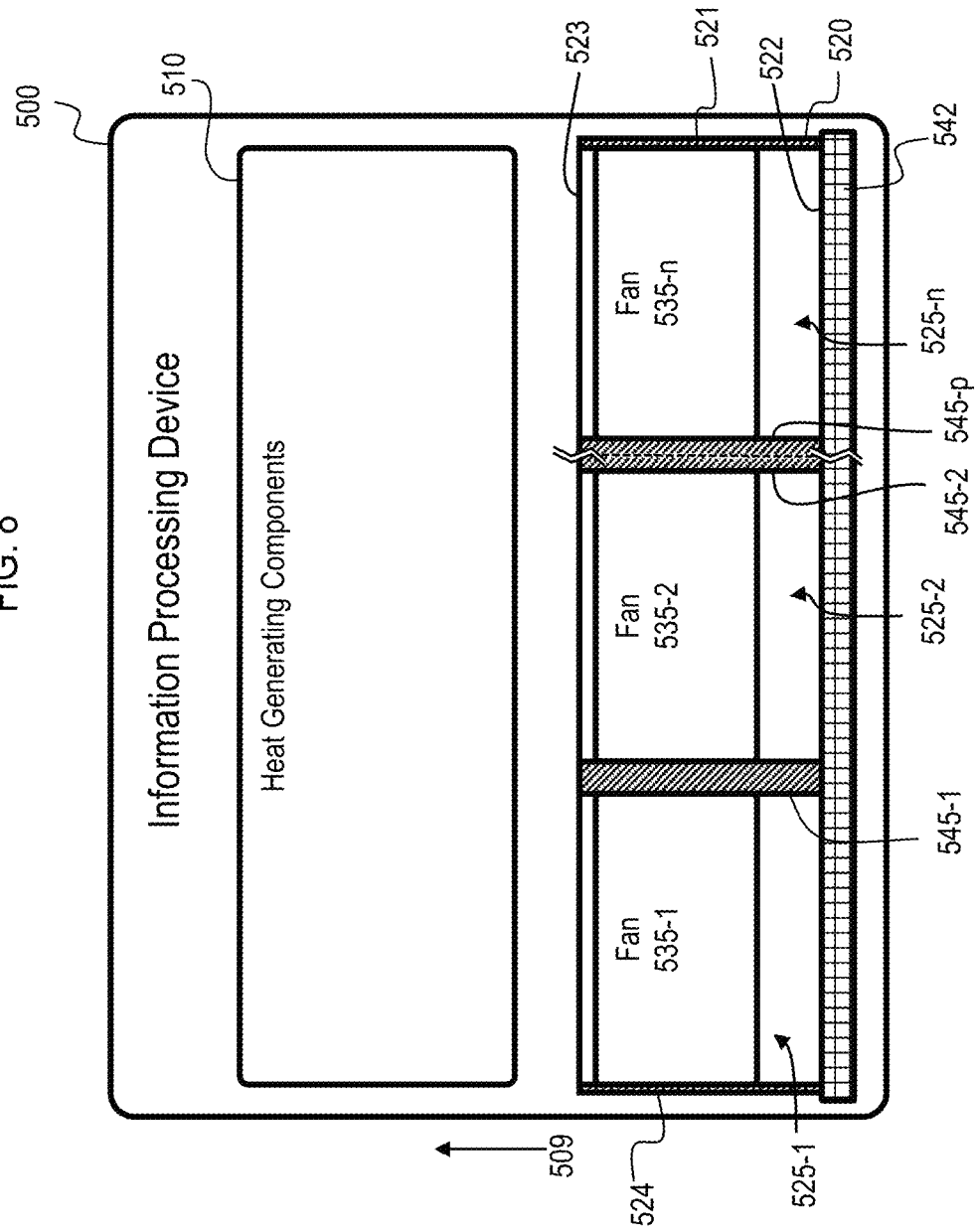
FIG. 8 is a block diagram schematically illustrating another example information processing device with separators.

Turning now to FIG. 8, another example information processing device 500 will be described. Some components of the information processing device 500 correspond to (i.e., are the same as, similar to, and/or example configurations of) components of the information processing device 100 described above. The components of the information processing device 500 and the components of the information processing device 100 which correspond to one another are given reference numbers with the same last two digits, such as 135 and 535. The descriptions above of the components of the information processing device 100 are applicable to the corresponding components of the information processing device 500 (unless otherwise indicated or logically contradictory), and thus duplicative descriptions of some aspects already described above are omitted below.

As shown in FIG. 8, the information processing device 500 comprises heat generating components 510, fans 535, a fan plenum 520, and a recirculation inhibition mechanism 540 (compromising dividers 545 which form sub-compartments 525 and a plenum impedance element 542). These components of the device 500 are similar to the corresponding component of the device 100 except that in the device 500 the fans 535 are configured to blow air in the direction 509 (which is opposite to the direction 109 in FIG. 2), consequently the outlet 523 and inlet 522 of the plenum 520 are reversed relative to the outlet 123 and inlet 122, and therefore the plenum impedance element 542, which is disposed on the inlet 522, is disposed on the opposite side of the plenum 520 than in FIG. 2. Airflow direction through the device 500 will also be the opposite of those illustrated in FIGS. 3 and 4. Other than this, the structure, function, and operation of the device 500 is the same as that described above in relation to the device 100.

FIGS. 5-8 illustrate some variations or modifications of the information processing device 100. These variations/modifications are illustrated individually to ease understanding, but it should be understood that these variations/modification could be combined together in various examples. For example, the plenum impedance element being disposed internally to the plenum as shown in FIG. 5 could be combined with the shortened dividers that do not extend the full length of the plenum as in FIG. 6. As another example, the plenum impedance element being disposed internally to the plenum as shown in FIG. 5 could be combined with the fans being disposed external to the plenum as shown FIG. 7. As another example, any of the aforementioned variations or combinations of variations could be combined with the airflow direction and plenum orientation reversal shown in FIG. 8.

Figure 9:
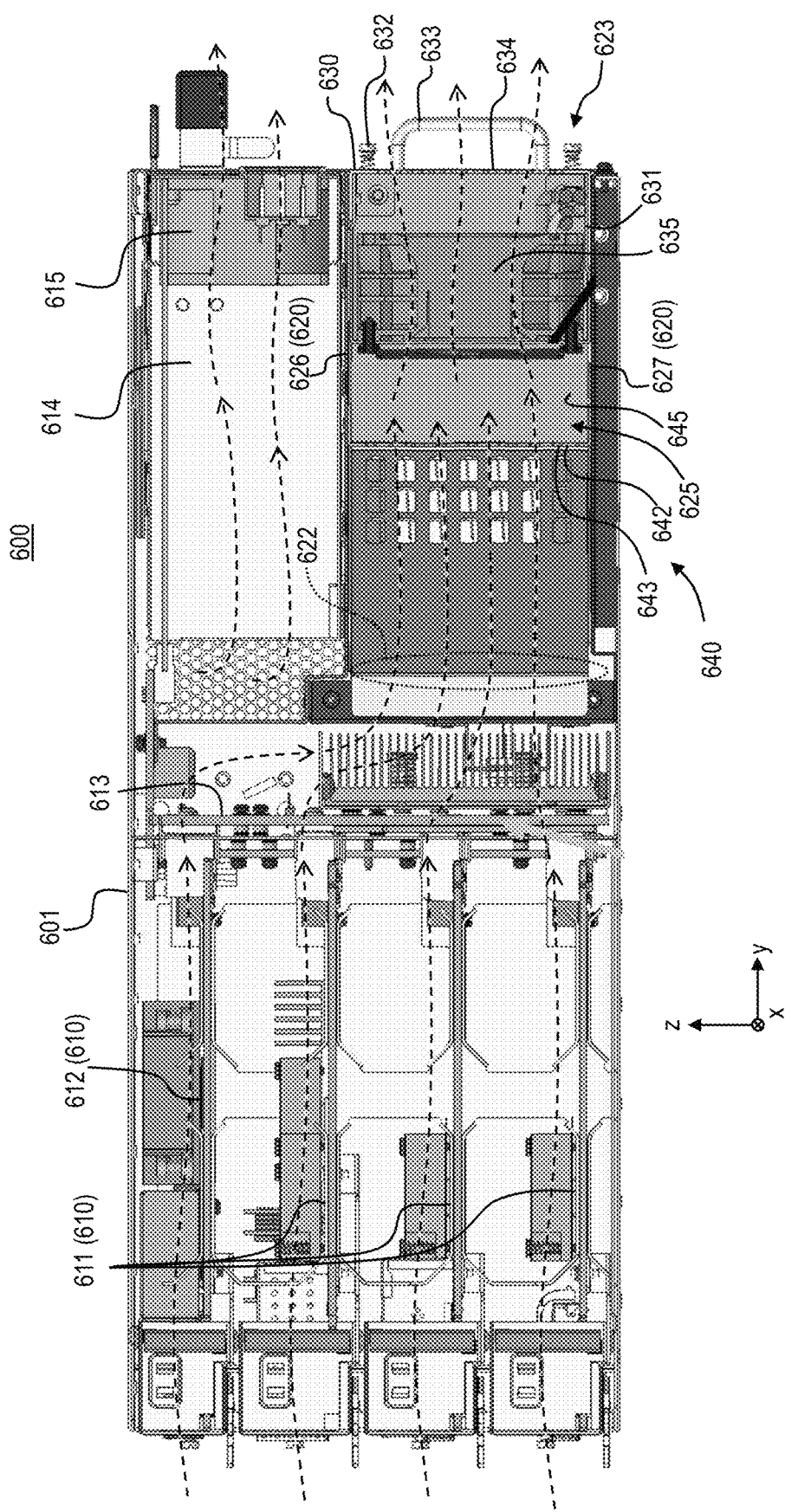
FIG. 9 is a sectional view of another example information processing device, with the section taken along a longitudinal dimension of the device.

Turning now to FIG. 9, another example information processing device 600 is described. Some components of the information processing device 600 correspond to (i.e., are the same as, similar to, and/or example configurations of) components of the information processing device 100 described above. The components of the information processing device 600 and the components of the information processing device 100 which correspond to one another are given reference numbers with the same last two digits, such as 135 and 635. The descriptions above of the components of the information processing device 100 are applicable to the corresponding components of the information processing device 600 (unless otherwise indicated or logically contradictory), and thus duplicative descriptions of some aspects already described above are omitted below.

As shown in FIG. 9, the information processing device 600 comprises heat generating components 610, fans 635, a fan plenum 620, and a recirculation inhibition mechanism 640 (compromising dividers 645 which form sub-compartments 625 and a plenum impedance element 642).

In this example, the information processing device 600 is a networking device comprising multiple switches 611 housed within a common chassis 601 and stacked in the z-axis direction, with each of the switches 611 comprising one or more of the heat generating components 610. In addition, the device 600 may comprise a system control module 612 with processing resources to control operations of the device 600, which constitute further instances of the heat generating components 610. The switches 611 and system control module 612 may be insertable and removable from the chassis 601 of the device 600 by sliding along the y-axis direction into or out from bays in a front portion of the chassis 601. The switches 611 and system control module 612, when installed, are removably connectable to a backplane 613, which may communicably connect the switches 611 and control module 612 and/or provide operational power thereto. The information processing device 600 further comprises a power supply unit 614, which supplies power to the other components of the device 600.

As shown in FIG. 9, the information processing device 600 also comprises a plenum 620. The plenum 620 comprises horizontal walls 626 and 627 which extend parallel to the x-y plane. The plenum 620 also comprises two vertical walls (not visible) which extend parallel to the y-z plane. The plenum 620 has an inlet opening 622 near the backplane 613 and an outlet opening 623 at the rear of the chassis 601 of the device 600. Air flows through the plenum 620 along a central axis, which is parallel to the y-axis and extends between inlet opening 622 and outlet opening 623.

As shown in FIG. 9, the information processing device 600 also comprises a removable multi-fan module 630 (also referred to as a fan tray). The multi-fan module 630 is removably inserted into the plenum 620. Specifically, the multi-fan module 630 is inserted into the plenum 620 by moving the multi-fan module 630 along a-y direction through the outlet opening 623 until a perforated rear panel 634 of the multi-fan module 630 is more-or-less aligned with the rear panel of the chassis 601 of the device 600. When the multi-fan module 630 is so installed, the perforated rear panel 634 extends across and substantially covers (fills) the outlet opening 623 of the plenum 620. The multi-fan module 630 is removably attached to the chassis of the device 600 via fastener 632, and a handle 633 is provided to facilitate insertion/removal of the multi-fan module 630. The multi-fan module 630 comprises a structural frame comprising a supporting tray 631 and the perforated rear panel 624, and in some cases additional walls (e.g., lateral and/or top walls). The multi-fan module 630 also comprises a plurality of fans 635 attached to the structural frame. For example, four fans 635 are provided in some implementations. Only one of these fans 635 is visible in the cross-sectional view of FIG. 9, but the other fans 635 are similar to the illustrated fan 635 and these fans 635 are distributed in a line extending along the x-axis (into the page) in FIG. 9 (similar to the arrangement illustrated in FIG. 6).

The recirculation inhibition mechanism 640 comprises a plenum impedance element 642, which in this example is disposed within the interior of the plenum 620. In this example, the plenum impedance element 642 comprises a sheet metal with perforations 643 formed (e.g., stamped) therein, with the plenum impedance element 642 being joined to the plenum walls by fasteners (e.g., rivets) or some other fastening technique. The plenum impedance element 642 extends fully across the interior of the plenum 620 such that all of the air flowing from the inlet opening 622 through the plenum 620 passes through the plenum impedance element 642 (i.e., through the perforations 643). The solid portions of the plenum impedance element 642 block airflow while the perforations 643 pass airflow, and thus the plenum impedance element 642 has a non-zero airflow impedance. The airflow impedance may depend on the ratio of the area of the open perforations 643 to the area of the solid portions.

The recirculation inhibition mechanism 640 also comprises a plurality of dividers 645 which extend parallel to the y-z plane. Only one such divider 645 is visible in FIG. 9, but the other dividers 645 are similar and are distributed along the x-axis (along a line extending into and out of the page) such that each divider 645 is aligned with the region between two adjacent fans 635 (similar to the arrangement illustrated in FIG. 6). Each divider 645 extends along the y-axis dimension from the inlet side of the fans 635 (the side of the fans 635 facing in the −y direction) to the plenum impedance element 642. Further, each divider 645 extends along the z-axis dimension from the bottom horizontal wall 627 of the plenum 620 to the top horizontal wall 626 of the plenum 620. Thus, the dividers 645 define sub-compartments 625 in the plenum 620 in the region between the plenum impedance element 642 and the fans 635 (only one sub-compartment 625 is visible in FIG. 9, but additional sub-compartments 625 are present between the dividers 645). These sub-compartments 625 are such that, for air from one sub-compartment 625 to flow to another sub-compartment 625 without passing through the fans, the air must flow through the plenum impedance element 642 twice, as described above in relation to the sub-compartments 125.

FIG. 9 illustrates some example airflow through the device 600 during normal operation. In this example, the air flows generally from front to back (+y direction), initially entering the device 600 via perforations in the front of the switches 611 and system control module 612 and/or other openings in a front of the chassis 601. The air then flows over the heat generating components 610 and absorbs heat therefrom. Subsequently, the heated air flows rearward (+y direction) through the backplane 613 via openings therein and flows into the plenum 620 via inlet opening 622. In the illustrated implementation, some of the heated air, after passing through the backplane 613, turns and flows downward (−z direction) towards the plenum 620, due to positioning of the plenum 620 near a bottom of the chassis 601. This air then passes through the plenum impedance element 642, enters the sub-compartments 625, passes through the fans 635, and then is ejected from the device 600 via the perforated rear panel 634.

In the illustrated implementation, the power supply unit 614 also has its own internal fan 615 to cool its components. Air drawn by this fan 615 to cool the power supply unit 614 may follow an airflow path which is separated from the airflow paths which cool the components 610. For example, the power supply unit 614 may be disposed in a compartment within the chassis 601 which is separated from the remainder of the interior of the chassis 601, and perforations in a side wall of the chassis 601 may supply the air to the power supply unit 614.

Although not illustrated, in the event of one of the fans 635 failing, some air may be drawn by the still-operational fans 635 backwards (−y direction) through the perforated rear panel 634 and the failed fan 635 into the sub-compartment 625 aligned with the failed fan 635, then the air continues to flow in the −y direction through the plenum impedance element 642 into a forward portion of the plenum 620, then the air turns and flows along the +/−x directions, then the air turns and flows in the +y direction back through the plenum impedance element 642 into the adjacent sub-compartments 625 of the still-operational fans 635. Thus, some recirculation does occur. However, because the recirculated air has to pass through the plenum impedance element 642 twice (and the perforated rear panel 634 as well), and because these have a non-zero impedance, the flow of recirculated air is restricted. According, the heat generating components 610 may be kept cool notwithstanding the failure of the fan 635.

Thermally Coupled: As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermally conductive intermediary (e.g., a heat pipe, heat spreader, etc.) (or to a chain of thermally conductive intermediaries thermally coupled together), or (3) a heat transfer coefficient between the two objects is 10 $W \cdot m^{-2} \cdot K^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 $W \cdot m^{-2} \cdot K^{-1}$ or greater at any temperature between 0° C. and 100° C., (2) the object is continuous piece of a material that has a thermal conductivity (often denoted k, $\lambda$, or $\kappa$) between the two interfaces of 1 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W \cdot m^{-1} \cdot K^{-1}$ between 0° C. and 100° C. include almost all metals and their alloys (e.g., copper, aluminum, gold, etc.), some plastics (e.g., TECA-COMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 $W \cdot m^{-2} \cdot K^{-1}$ or greater at any temperature between 0° C. and 100° C., (2) the object is continuous piece of a material that has a thermal conductivity (often denoted k, $\lambda$, or $\kappa$) between the two interfaces of 100 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is 100 $W \cdot m^{-1} \cdot K^{-1}$ or greater between 0° C. and 100° C. include certain types of copper, aluminum, silver, and gold.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An information processing device, comprising:
   heat generating components;
   a plenum;
   a plurality of fans arranged to cause air to flow through the plenum and the information processing device to cool the heat generating components;
   a plenum impedance element extending across the plenum such that, in a state of the fans all being operational, the air passing through the plenum passes through the plenum impedance element prior to reaching the plurality of fans; and
   one or more dividers disposed in the plenum and defining a plurality of sub-compartments in the plenum, each of the sub-compartments corresponding to one of the fans and configured to supply air to or receive air from the corresponding fan;
   wherein the dividers and the plenum impedance element are configured such that, in the event of one of the fans failing, air recirculating through the failed fan passes though the plenum impedance element twice before reaching an adjacent fan.

2. The information processing device of claim 1, wherein the plurality of fans are disposed within the plenum.

3. The information processing device of claim 2, wherein the plurality of fans are configured to cause the air to flow from the heat generating components into an inlet opening of the plenum, and the plenum impedance element covers the inlet opening of the plenum.

4. The information processing device of claim 2, wherein the plurality of fans are configured to cause the air to flow from an outlet opening of the plenum to the heat generating components, and the plenum impedance element covers an inlet opening of the plenum.

5. The information processing device of claim 2, wherein the plenum impedance element is disposed within an interior of the plenum.

6. The information processing device of claim 2, wherein the dividers extend between the fans such that the fans are located in separate ones of the sub-compartments.

7. The information processing device of claim 2, wherein the dividers extend from an inlet side of the fans to the plenum impedance element.

8. The information processing device of claim 1, wherein the plurality of fans are disposed outside the plenum with inlet openings of the fans positioned adjacent to an outlet opening of the plenum such that air from the plenum is pulled into the inlet openings of the fans via the outlet opening of the plenum.

9. The information processing device of claim 8, wherein the dividers extend from the inlets of the fans to the plenum impedance element.

10. The information processing device of claim 9, wherein the plenum impedance element covers an inlet opening of the plenum.

11. The information processing device of claim 9, wherein the plenum impedance element is disposed within an interior of the plenum.

12. The information processing device of claim 1, wherein the plurality of fans are disposed outside the plenum with outlet openings of the fans positioned adjacent to an inlet opening of the plenum such that air expelled from the fans is pushed into the inlet opening of the plenum.

13. The information processing device of claim 1, wherein the plenum impedance element comprises a wire screen, a wire mesh, a wire honeycomb, a lattice, or a perforated sheet.

14. An information processing device, comprising:
    one or more network switches disposed in a front of a chassis;
    a plenum comprising an inlet opening and an outlet opening, the plenum disposed such that the outlet opening is at a rear of the chassis;
    a plurality of fans disposed in the plenum and configured to cause air to flow from the front of the chassis through the network switches to cool the network switches, from the network switches into the plenum via an inlet opening of the plenum, and then out of the plenum via the outlet opening;
    a plenum impedance element extending across the plenum, in a state of the fans all being operational, the air passing through the plenum passes through the plenum impedance element prior to reaching the plurality of fans; and
    a plurality of dividers disposed in the plenum and defining a plurality of sub-compartments in the plenum, each of the sub-compartments corresponding to one of the fans and configured to supply air to the corresponding fan;
    wherein the dividers and the plenum impedance element are configured such that, in the event of one of the fans failing, air recirculating through the failed fan passes though the plenum impedance element twice before reaching an adjacent fan.

15. The information processing device of claim 14, comprising:
    a multi-fan module comprising a supporting frame and the plurality of fans attached to the supporting frame, wherein the multi-fan module is removably installable in the information processing device by insertion into the plenum via the outlet opening of the plenum.

16. The information processing device of claim 14, wherein the plenum impedance element is disposed within an interior of the plenum.

17. The information processing device of claim 16, wherein the dividers extend from inlets of the plurality of fans to the plenum impedance element.

18. The information processing device of claim 14, wherein the plenum impedance element comprises a wire screen, a wire mesh, a wire honeycomb, a lattice, or a perforated sheet.

19. A method, comprising:
    causing a plurality of fans to flow air past heat generating components of an information processing device to absorb heat from the heat generating components;

causing the air to flow into a plenum of the information processing device and through a plenum impedance element extending across the plenum;

causing the air to flow from the plenum impedance element through a plurality of sub-compartments in the plenum to the plurality of fans, wherein the sub-compartments are defined by dividers which extend from the fans to the plenum impedance element and each of sub-compartments supplies a portion of the air to a corresponding one of the fans; and in response to a failure of one of the fans, directing recirculating air which recirculates backwards through the failed fan to pass through the plenum impedance element twice before passing to another one of the plurality of fans which remains operational.

20. The method of claim 19, comprising:

wherein the plurality of fans are disposed within an interior of the plenum.

\* \* \* \* \*